(12) United States Patent
Huang

(10) Patent No.: US 10,777,450 B2
(45) Date of Patent: Sep. 15, 2020

(54) SEMICONDUCTOR SUBSTRATE AND METHOD OF PROCESSING THE SAME

(71) Applicant: NANYA TECHNOLOGY CORPORATION, New Taipei (TW)

(72) Inventor: Chih-Wei Huang, Taoyuan (TW)

(73) Assignee: Nanya Technology Corporation, New Taipei (TW)

(*) Notice: Subject to any disclaimer, the term of this patent is extended or adjusted under 35 U.S.C. 154(b) by 0 days.

(21) Appl. No.: 16/281,485

(22) Filed: Feb. 21, 2019

(65) Prior Publication Data
US 2020/0211896 A1 Jul. 2, 2020

Related U.S. Application Data

(60) Provisional application No. 62/785,366, filed on Dec. 27, 2018.

(51) Int. Cl.
| | |
|---|---|
| H01L 23/48 | (2006.01) |
| H01L 29/40 | (2006.01) |
| H01L 21/768 | (2006.01) |
| H01L 21/311 | (2006.01) |

(52) U.S. Cl.
CPC .. *H01L 21/76831* (2013.01); *H01L 21/31144* (2013.01); *H01L 21/76802* (2013.01)

(58) Field of Classification Search
CPC ............... H01L 21/78; H01L 21/6836; H01L 21/76832; H01L 23/49822; H01L 21/3205; H01L 21/76831; H01L 21/76835; H01L 21/7684; H01L 21/76843

USPC .......................................................... 257/734
See application file for complete search history.

(56) References Cited

U.S. PATENT DOCUMENTS

| 2006/0255397 A1* | 11/2006 | Noble .................... H01L 21/84 257/315 |
| 2014/0183600 A1* | 7/2014 | Huang .................. H01L 29/785 257/192 |

FOREIGN PATENT DOCUMENTS

TW 200731435 A 8/2007

OTHER PUBLICATIONS

Office Action dated Dec. 9, 2019 related to Taiwanese Application No. 108109569.

* cited by examiner

*Primary Examiner* — Theresa T Doan
(74) *Attorney, Agent, or Firm* — Muncy, Geissler, Olds & Lowe, P.C.

(57) ABSTRACT

The present disclosure provides a semiconductor substrate. The semiconductor substrate includes a base, a plurality of mesas extending from an upper surface of the base, a plurality of protrusions connected to the mesas, an insulating layer disposed on the protrusions, a capping layer disposed on the insulating layer, and a passivation layer disposed on sidewalls of the protrusions, the insulating layer, and the capping layer. The passivation layer includes at least one first film and at least one second film arranged in a staggered configuration.

9 Claims, 11 Drawing Sheets

SEMICONDUCTOR SUBSTRATE AND METHOD OF PROCESSING THE SAME

PRIORITY CLAIM AND CROSS-REFERENCE

This application claims the priority benefit of U.S. provisional application Ser. No. 62/785,366, filed on Dec. 27, 2018. The entirety of the above-mentioned patent application is hereby incorporated by reference herein and made a part of this specification.

TECHNICAL FIELD

The present disclosure relates to a semiconductor structure and a method of processing the same, and more particularly, to a semiconductor substrate and a method of processing a semiconductor substrate.

DISCUSSION OF THE BACKGROUND

Semiconductor devices and integrated circuits are becoming more highly integrated. As a result, ongoing research seeks to improve characteristics of such devices and circuits, and to secure desirable process advantages. In semiconductor memory devices, as the memory capacity of such devices increases, a critical dimension of patterns in the device is reduced. As a result, photolithography processes for forming a pattern over a wafer are vital components of the semiconductor manufacturing process.

In general, a substrate is patterned and then etched to form active areas. However, at the completion of the etching process, reentrant undercutting has been observed at the interface of the substrate and the pad oxide overlying the substrate, which can lead to undesirable voids during subsequent filling with a dielectric.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor substrate. The semiconductor substrate includes a base, a plurality of mesas, a plurality of protrusions, an insulating layer, a capping layer, and a passivation layer. The mesas extend from an upper surface of the base. The protrusions are connected to the mesas. The insulating layer is disposed on the protrusions. The capping layer is disposed on the insulating layer. The passivation layer is disposed on sidewalls of the protrusions, the insulating layer and the capping layer. The passivation layer includes at least one first film and at least one second film arranged in a staggered configuration.

In some embodiments, outer peripheries of the passivation layer are continuous with sidewalls of the mesas.

In some embodiments, the protrusions have a critical dimension and a height being greater than twice the critical dimension.

In some embodiments, a width of the mesas gradually decreases at positions of increasing distance from the base.

In some embodiments, included angles between the base and the mesas are in a range between 90 and 105 degrees.

In some embodiments, the semiconductor substrate further includes an isolating layer encircling the mesas and the passivation layer.

In some embodiments, an upper surface of the isolation layer is coplanar with the top surface of the capping layer.

In some embodiments, the base, the mesas and the protrusions are integrally formed.

In some embodiments, the first film and the second film are atomic layer deposition layers.

Another aspect of the present disclosure provides a method of processing a semiconductor substrate. The method includes steps of providing a supporting substrate; depositing an insulating layer on the supporting substrate; depositing a capping layer on the insulating layer; patterning the capping layer and the insulating layer to form a plurality of trenches penetrating through the capping layer and the insulating layer and extending into the supporting substrate, wherein the remaining supporting substrate comprises a base and a plurality of protrusions connected to the base; depositing a passivation layer on the sidewalls of the capping layer, the insulating layer and the protrusions; and etching the base through the trenches to form a plurality of mesas underlying the protrusions.

In some embodiments, the method further includes a step of depositing an isolating layer to encircle the mesas and the passivation layer.

In some embodiments, the depositing of the passivation layer on the sidewalls of the capping layer, the insulating layer and the protrusions includes steps of depositing a first layer of the passivation layer on a top surface of the capping layer, on an upper surface of the base, and on the sidewalls of the capping layer, the insulating layer and the protrusions; depositing a second layer of the passivation layer on the first layer; and performing an etching process to remove the first layer and the second layer disposed on the top surface and the upper surface.

In some embodiments, the first layer and the second layer have at least one uniform thickness.

In some embodiments, included angles between a surface of the base and the sidewalls of the protrusions are substantially equal to 90 degrees.

In some embodiments, the patterning of the capping layer to form the plurality of trenches penetrating through the capping layer and the insulating layer and extending into the supporting substrate includes steps of coating a photoresist layer on the capping layer; patterning the photoresist layer to form a photoresist pattern having a plurality of openings; and removing portions of the capping layer, the insulating layer, and the supporting substrate exposed through the openings.

With the above-mentioned configurations of the semiconductor substrate, the reentrant undercutting in the protrusion is prevented since the passivation layer is deposited on sidewalls of the protrusions. As a result, high aspect ratio active areas comprised of the protrusions and the mesa on the base, and a void-free isolation layer, are achieved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
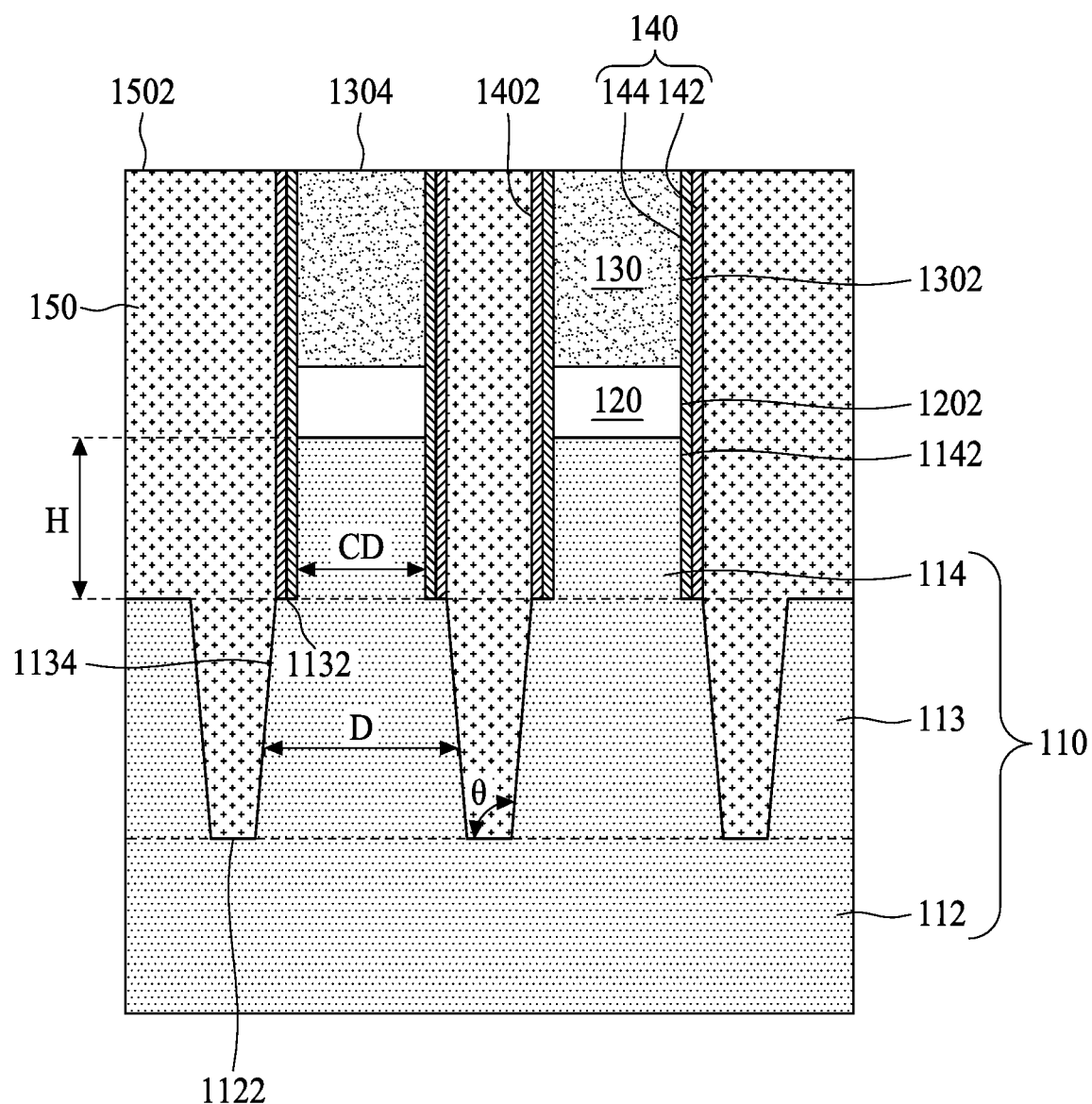
FIG. 1 is a cross-sectional view of a semiconductor substrate in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor substrate 10 in accordance with some embodiments of the present disclosure. Referring to FIG. 1, in some embodiments, the semiconductor substrate 10 includes a base 112, a plurality of mesas 113 extending from an upper surface 1122 of the base 112, a plurality of protrusions 114 overlying the mesas 113, an insulating layer 120 disposed on the protrusions 114, a capping layer 130 disposed on the insulating layer 120, and a passivation layer 140, including two or more layers, disposed on sidewalls 1302 of the capping layer 130, on sidewalls 1202 of the insulating layer 120, and on sidewalls 1142 of the protrusions 114.

In some embodiments, the protrusions 114 have a critical dimension CD and a height H being greater than twice the critical dimension CD. In some embodiments, the protrusions 114 extend from upper surfaces 1132 of the mesas 113. In some embodiments, the sidewalls 1142 of the protrusions 114 are not continuous with sidewalls 1134 of the mesas 113. In some embodiments, the mesas 113 have a width D, which gradually decreases at positions of increasing distance from the base 112. In some embodiments, included angles θ between the base 112 and the mesas 113 are in a range between 90 and 110 degrees. In some embodiments, the base 112, the mesas 113 and the protrusions 114 are integrally formed. In some embodiments, the base 112, the mesas 113 and the protrusions 114 may include silicon.

In some embodiments, the insulating layer 120 includes oxide, such as silicon dioxide. In some embodiments, the insulating layer 120 may be a thermal oxidation layer or a deposition layer. In some embodiments, the capping layer 130 overlying the insulating layer 120 includes dielectric, such as nitride.

In some embodiments, the passivation layer 140 may include one or more first layers 142 and one or more second layers 144 arranged in a staggered configuration. In some embodiments, outer peripheries 1402 of the passivation layer 140 are continuous with the sidewalls 1134 of the mesa 113. In some embodiments, the first layers 142 include silicon dioxide ($SiO_2$). In some embodiments, the second layers 144 include zirconium dioxide ($ZrO_2$) or hafnium dioxide ($HfO_2$). In some embodiments, the passivation layer 140 provides passivation during an etching process to protect against undercutting or notches in the protrusions 114.

In some embodiments, the semiconductor substrate 10 further includes an isolation layer 150 encircling the mesas 113 and the passivation layer 140. In some embodiments, an upper surface 1502 of the isolation layer 150 is coplanar with a top surface 1304 of the capping layer 130. In some embodiments, the isolating layer 150 includes oxide. In some embodiments, the semiconductor substrate 10 may be used for fabricating field effect vertical transistors.

Figure 2:
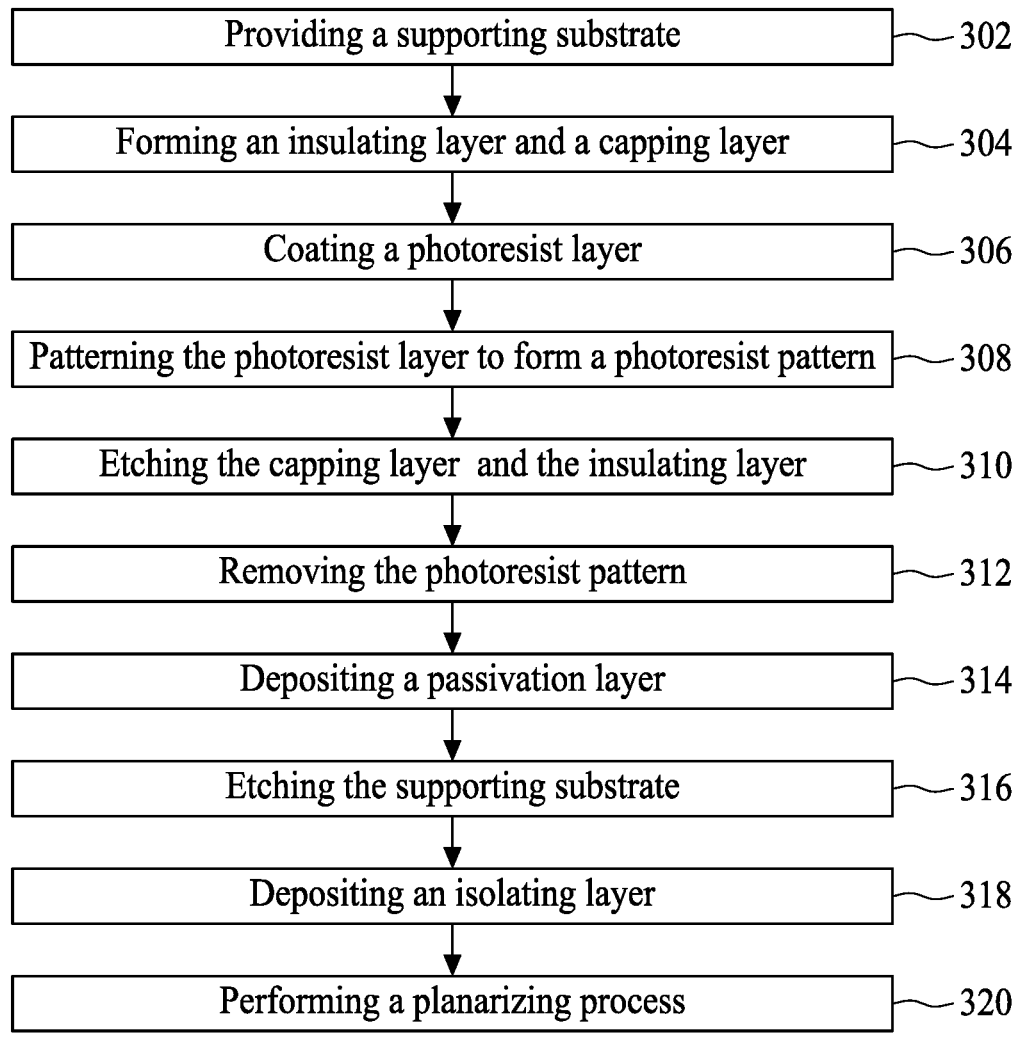
FIG. 2 is a flow diagram illustrating a method of manufacturing a semiconductor substrate in accordance with some embodiments of the present disclosure.

FIG. 2 is a flow diagram illustrating a method 300 of manufacturing a semiconductor substrate 10 in accordance with some embodiments of the present disclosure. FIGS. 3 to 11 are schematic diagrams illustrating various fabrication stages constructed according to the method 300 for manufacturing the semiconductor substrate 10 in accordance with some embodiments of the present disclosure. The stages shown in FIGS. 3 to 11 are also illustrated schematically in the flow diagram in FIG. 2. In the subsequent discussion, the fabrication stages shown in FIGS. 3 to 11 are discussed in reference to the process steps in FIG. 2.

Figure 3:
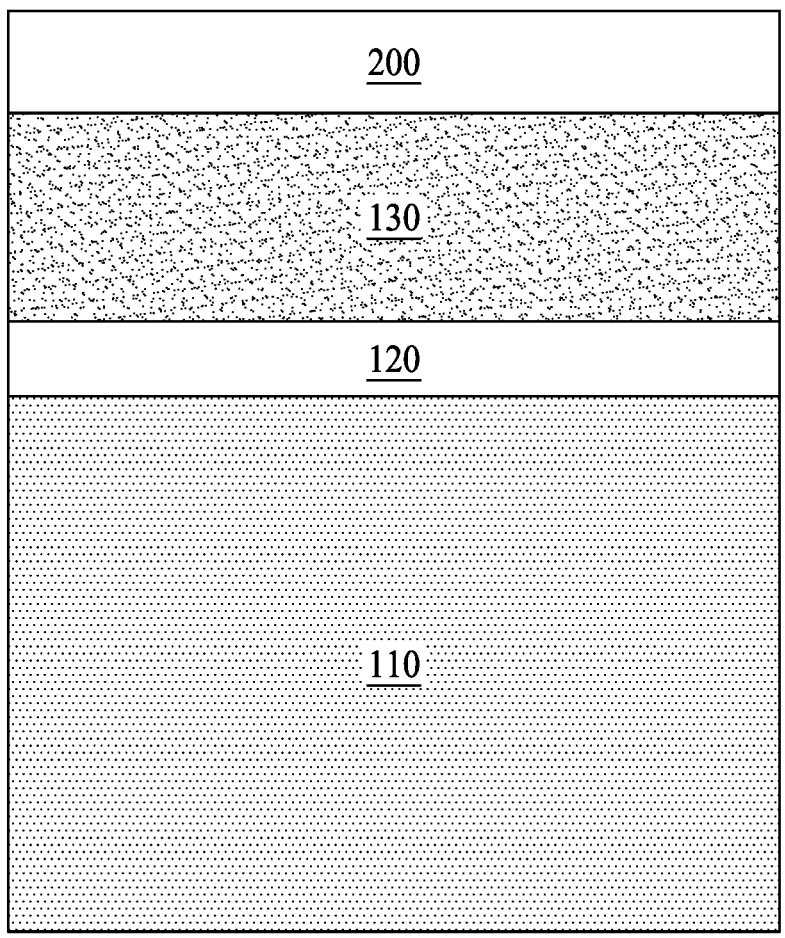
FIGS. 3 through 11 illustrate cross-sectional views of intermediate stages in the formation of a semiconductor substrate in accordance with some embodiments of the present disclosure.

Referring to FIG. 3, a supporting substrate 110 is provided according to a step 302 in FIG. 2. In some embodiments, the supporting substrate 110 is a bulk substrate. In some embodiments, examples of the material suitable for the supporting substrate 110 include, but are not limited to, silicon. In some embodiments, the supporting substrate 110 may be lightly doped monocrystalline silicon. In some embodiments, the supporting substrate 110 may be a p-type substrate.

Next, an insulating layer 120 and a capping layer 130 are sequentially formed over the supporting substrate 110 according to a step 304 in FIG. 2. In some embodiments, the insulating layer 120 fully covers the semiconductor substrate 110. In some embodiments, the insulating layer 120 includes oxide such as silicon dioxide (SiO$_2$). In some embodiments, the insulating layer 120 may be formed using a chemical vapor deposition (CVD) process. In some embodiments, the insulating layer 120 may be formed by oxidizing an outer portion of the supporting substrate 110. The capping layer 130 is disposed on the insulating layer 120. In some embodiments, the capping layer 130 may act as a hard mask for patterning the supporting substrate 110. In some embodiments, the capping layer 130 includes dielectric such as nitride.

Figure 4:
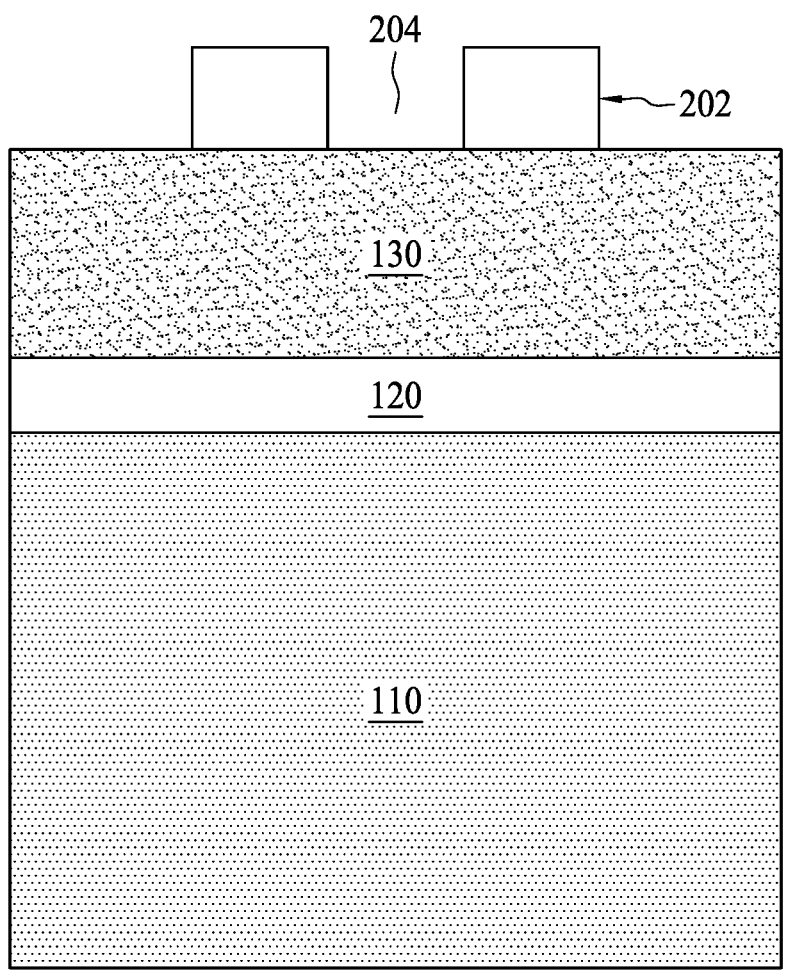

A photoresist layer 200 is then coated on the capping layer 130 according to a step 306 in FIG. 2. In some embodiments, the photoresist layer 200 is then patterned to define a region where the capping layer 130 and the insulating layer 120 are to be subsequently etched according to a step 308 in FIG. 2. In some embodiments, the photoresist layer 200 is patterned by steps including (1) exposing the photoresist layer 200 to a pattern (not shown), (2) performing a post-exposure back process, and (3) developing the photoresist layer 200, thereby forming a photoresist pattern 202, as shown in FIG. 4, having at least one opening 204. In some embodiments, a portion of the capping layer 130 to be subsequently etched is exposed through the openings 204.

Figure 5:
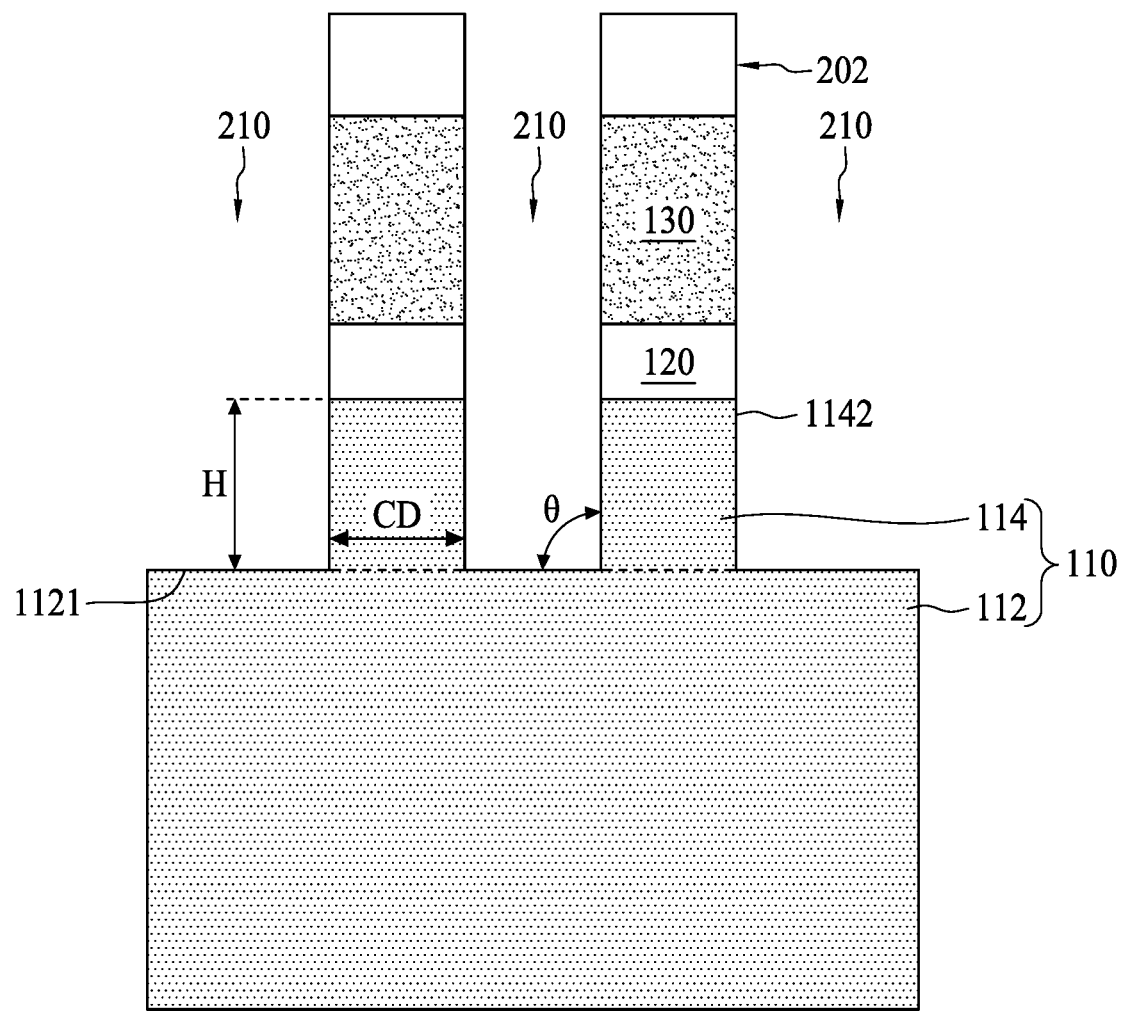

Referring to FIG. 5, in some embodiments, a patterning process is performed to etch the capping layer 130 and the insulating layer 120 and thus create one or more first trenches 210 according to a step 310 in FIG. 2. In some embodiments, the photoresist pattern 202 is transferred by dry etch onto the capping layer 130 and the insulating layer 120. In some embodiments, the patterning process stops at the supporting substrate 110. In some embodiments, the first trenches 210 penetrate through the capping layer 130 and the insulating layer 120 and extend into the supporting substrate 110. In some embodiments, the patterning process includes, for example, dry etching.

In some embodiments, the remaining supporting substrate 110 includes a base 112 and a plurality of protrusions 114 extending from a surface 1121 of the base 112. In some embodiments, the protrusions 114 have a critical dimension CD and a height H greater than twice the critical dimension CD. In some embodiments, included angles θ between sidewalls 1142 of the protrusions 114 and the surface 1121 may be equal to 90 degrees. In some embodiments, the photoresist pattern 202, the remaining capping layer 130 and the remaining insulating layer 120 overlap the protrusions 114.

Figure 6:
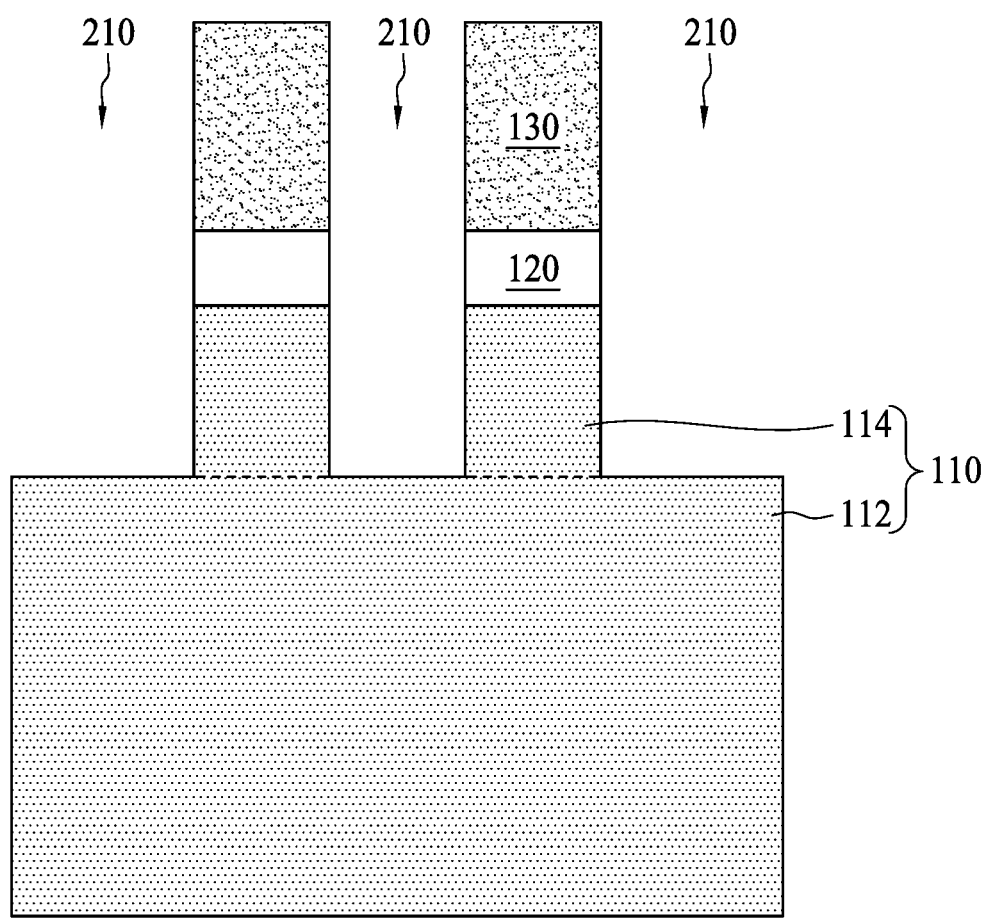

Referring to FIG. 6, after the patterning process, the photoresist pattern 202 is removed according to a step 312 in FIG. 2. In some embodiments, an ashing process or a wet strip process may be used to remove the photoresist pattern 202, wherein the wet strip process may chemically alter the photoresist pattern 202 so that it no longer adheres to the remaining capping layer 130.

Figure 7:
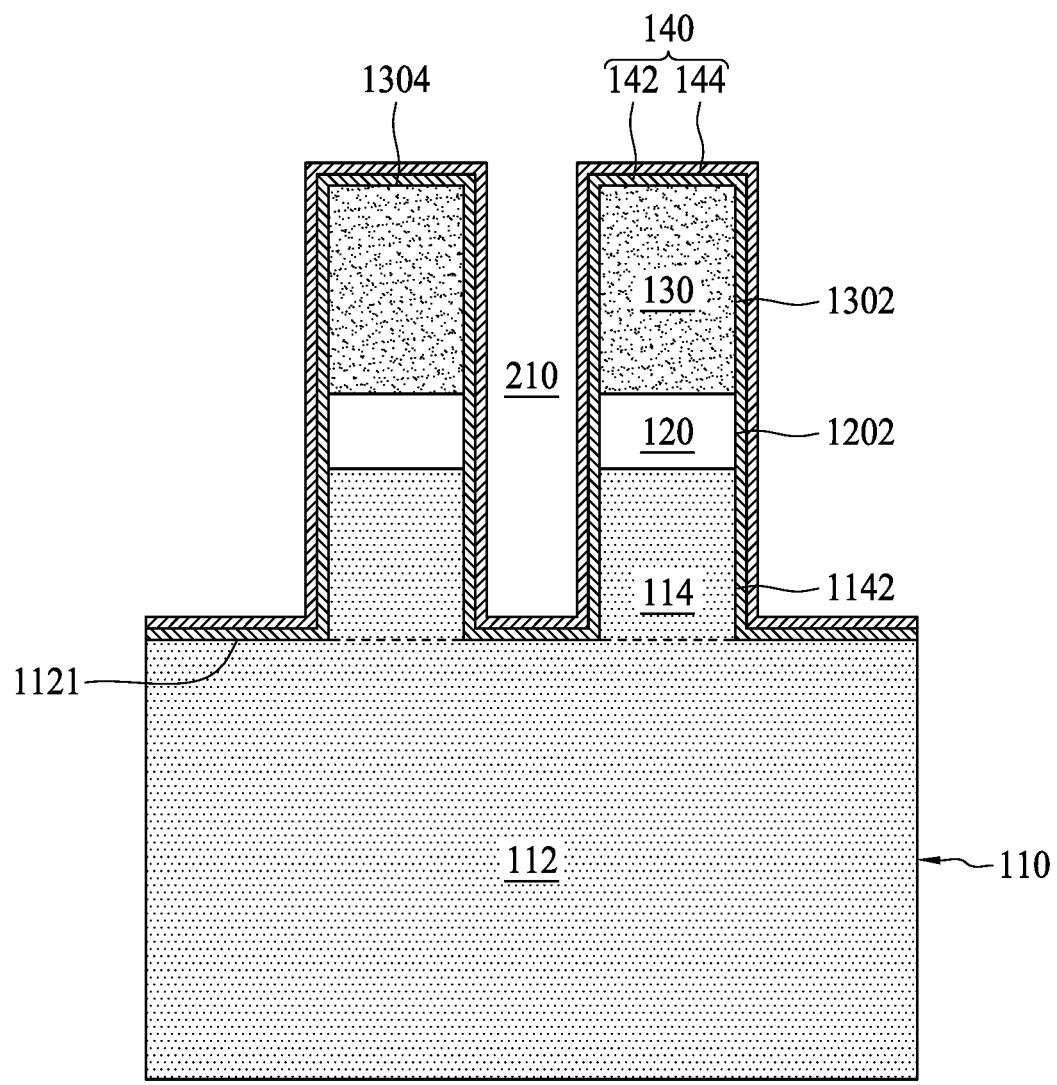

Referring to FIG. 7, in some embodiments, a passivation layer 140 is conformally deposited on the capping layer 130 and in the first trenches 210 according to a step 314 in FIG. 2. In some embodiments, the passivation layer 140 is deposited on sidewalls 1302 and top surfaces 1304 of the capping layer 130, on sidewalls 1202 of the insulating layer 120, on sidewalls 1142 of the protrusions 114, and on the surface 1121 of the base 112. In some embodiments, the passivation layer 140 has a uniform thickness. In some embodiments, the passivation layer 140 includes two or more atomic layer deposition (ALD) oxides. In some embodiments, the passivation layer 140 may include at least one first layer 142 and at least one second layer 144 arranged in a staggered configuration. In some embodiments, the first layer 142 may be in contact with the sidewalls 1202, 1302, 1142, the top surfaces 1304, and the surface 1121, and the second layer 144 is disposed on the first layer 142. In some embodiments, the first layer 142 and the second layer 144 have at least one uniform thickness. In some embodiments, the first layer 142 includes silicon dioxide. In some embodiments, the second layer 144 includes zirconium dioxide or hafnium dioxide. In some embodiments, the first layer 142 and the second layer 144 are formed using atomic layer deposition processes. In some embodiments, the second layer 144 is etched selectively relative to the base 112 of the supporting substrate 10. In some embodiments, the first layer 142 is used for preventing the second layer 144 from being in contact with the protrusions 114 of the supporting substrate 110, and thus the erosion of the protrusions 114 is prevented.

Figure 8:
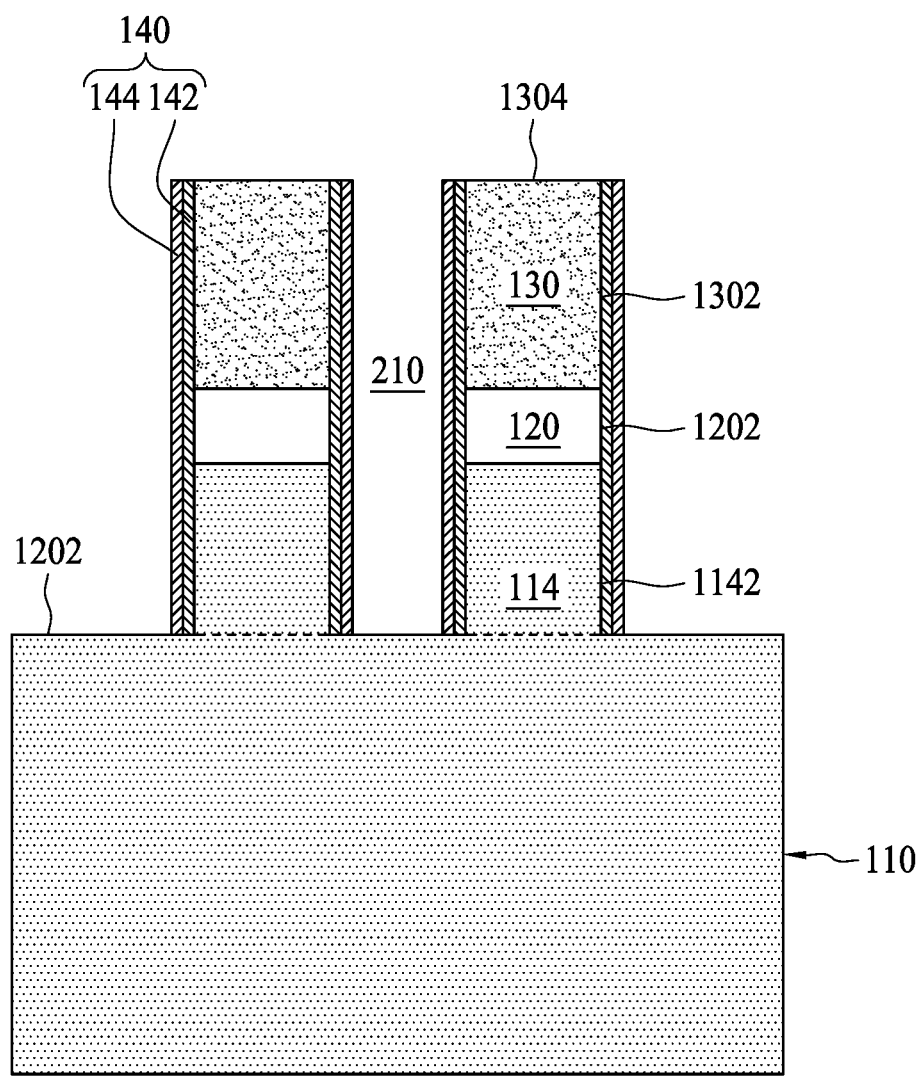

Referring to FIG. 8, in some embodiments, a portion of the passivation layer 140 is removed to expose the top surface 1304 of the capping layer 130 and the surface 1121 of the base 112. In some embodiments, the passivation layer 140 disposed on the top surface 1304 and the surface 1121 is removed, while the portion of the passivation layer 140 disposed on the sidewalls 1142, 1202, 1302 is left to protect against undercutting or notches in the protrusions 114 when the base 112 is subsequently etched. In some embodiments, the portion of the passivation layer 140 is removed using an anisotropic etching process.

Figure 9:
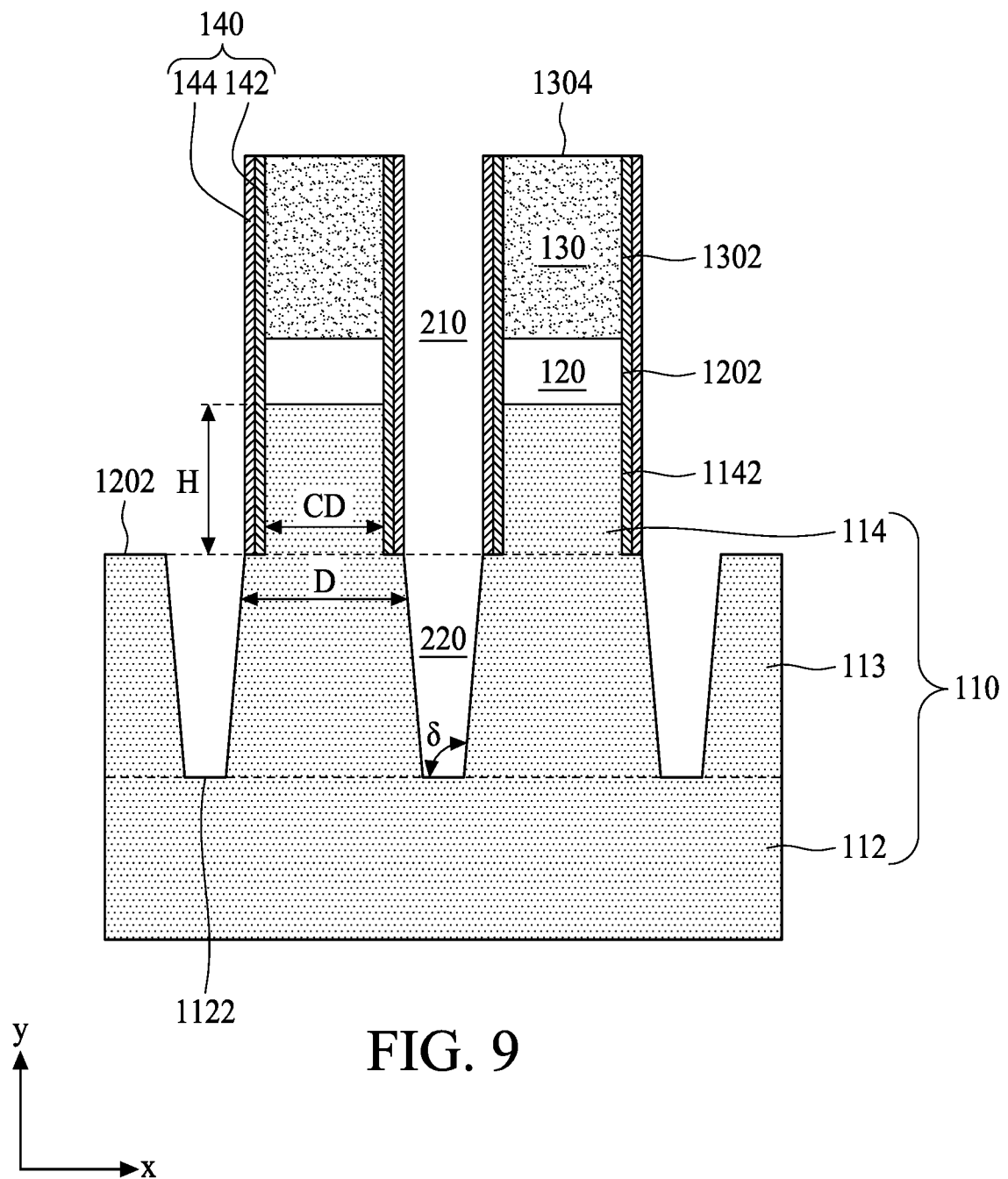

Referring to FIG. 9, in some embodiments, the base 112 is etched through the first trenches 210 according to a step 316 in FIG. 2. Accordingly, a plurality of mesas 113 underlying the protrusions 114 and a plurality of second trenches 220 between adjacent mesas 113 are formed. In some embodiments, the second trenches 220 communicate with the first trenches 210. In some embodiments, the base 112 is etched using the remaining capping layer 130, the remaining insulating layer 120, the protrusions 114, and the passivation layer 140 as an etching mask. In some embodiments, the base 112 is etched using an etching process, such as a reactive ion etching (RIE) process. Hereafter, a lower portion of the base 112, that is, a lower portion at which the mesas 113 are not formed, may be referring to simply as the base 112, which may be distinguished from the mesas 113.

In some embodiments, the mesas 113 may be disposed to be spaced apart from each other in a first direction x by a given distance. In some embodiments, each of plurality of mesas 113 may extend in a second direction y with a width D, wherein the width D gradually decreases at positions of increasing distance from the base 112 in the second direction y. In some embodiments, an included angle δ between the base 112 and the mesas 113 are in a range between 90 and 110 degrees.

Figure 10:
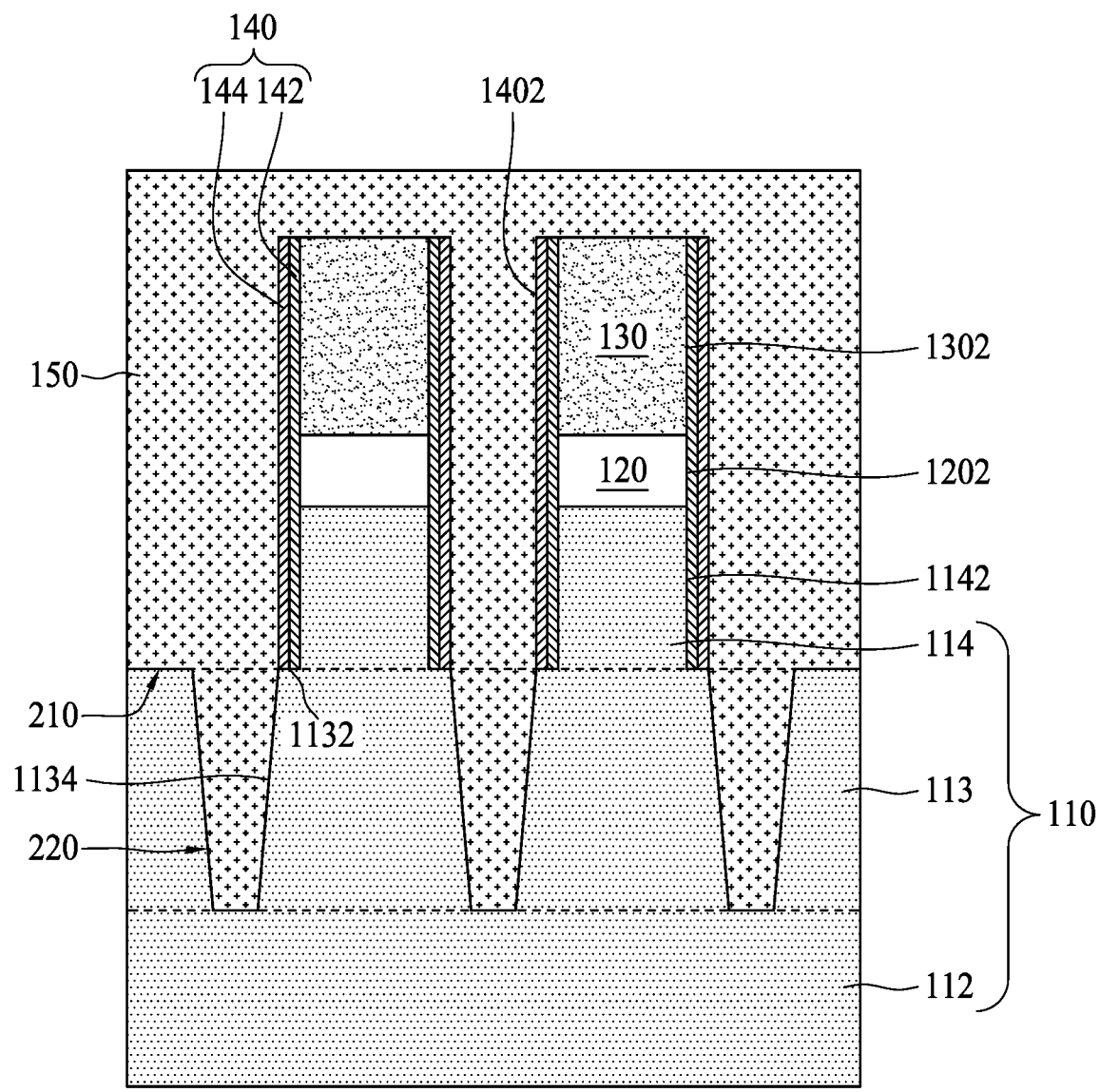

Referring to FIG. 10, in some embodiments, an isolating layer 150 is deposited on the capping layer 130 and the passivation layer 140 and in the first trenches 210 and the second trenches 220 according to a step 318 in FIG. 2. In some embodiments, the isolation layer 150 has a thickness sufficient to fill the first trenches 210 and the second trenches 220. In some embodiments, the protrusions 114, the insulating layer 120, and the capping layer 130 are spaced apart from the isolation layer 150 through the passivation layer 140. In some embodiments, the isolation layer 150 includes silicon oxide.

Figure 11:
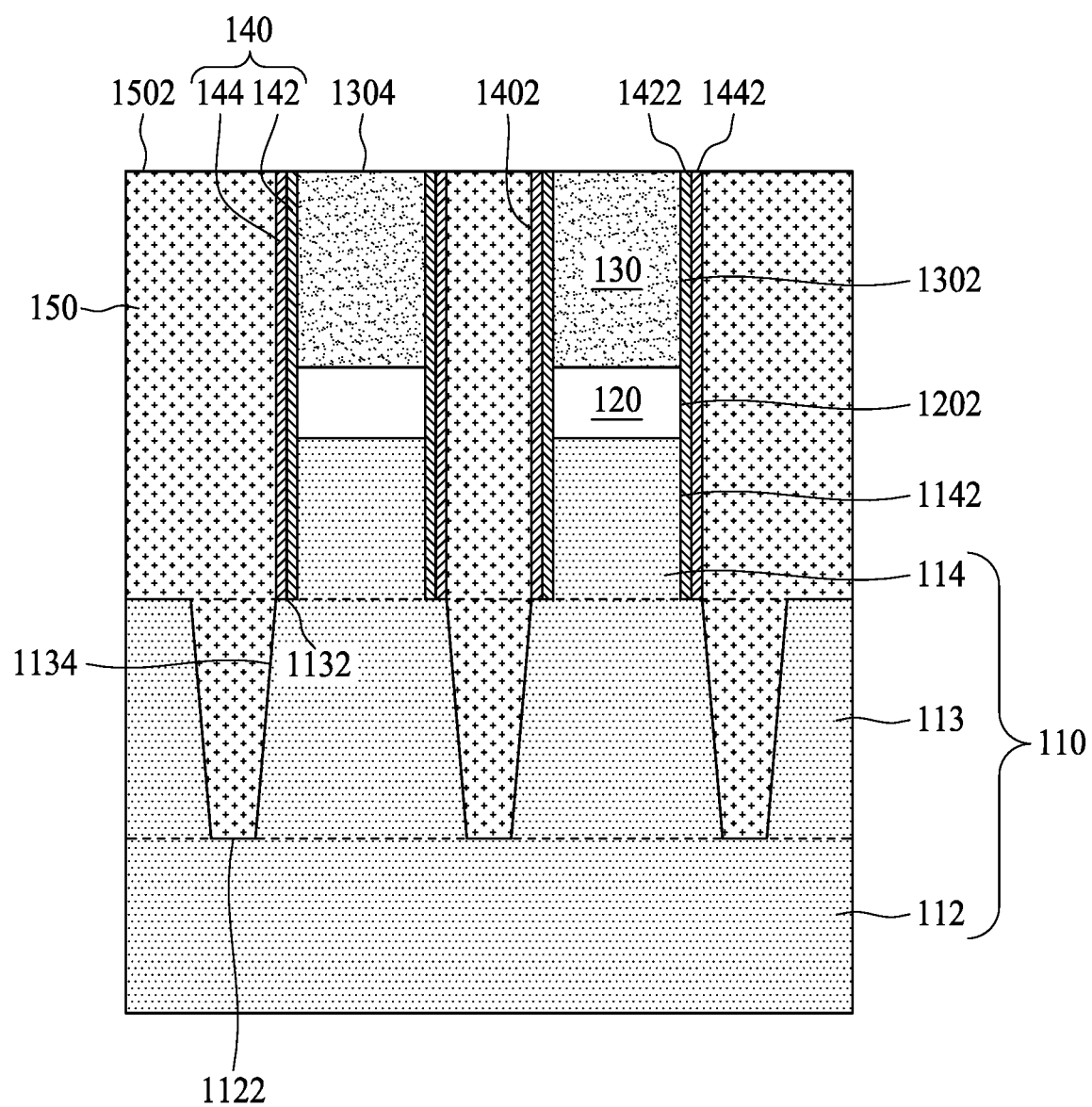

Referring to FIG. 11, in some embodiments, a planarizing process is performed to expose the capping layer 130 according to a step 320 in FIG. 2. Accordingly, the semiconductor substrate 10 is completely formed. In some embodiments, an upper surface 1502 of the isolation layer 150 is coplanar with the top surface 1304 of the capping layer 130. In some embodiments, end surfaces 1422, 1442 of the first layer 142 and the second layer 144 are also coplanar with the upper surface 1502. In some embodiments, the sidewalls 1142 of the protrusions 114 are not continuous with sidewalls 1134 of the mesas 113, and outer peripheries 1402 of the passivation layer 140 are continuous with sidewalls 1134 of the mesas 113.

In conclusion, with the configuration of the semiconductor substrate 10, the formation of a notch or undercut in the protrusion 114 is prevented since the passivation layer 140 is deposited on sidewalls 1402 of the protrusions 114. As a result, high aspect ratio active areas comprised of the protrusions 114 and the mesas 113 on the base 112, and a void-free isolation layer, are achieved.

One aspect of the present disclosure provides a semiconductor substrate. The semiconductor substrate includes a base, a plurality of mesas, a plurality of protrusions, an insulating layer, a capping layer, and a passivation layer. The mesas extend from an upper surface of the base. The protrusions are connected to the mesas. The insulating layer is disposed on the protrusions. The capping layer is disposed on the insulating layer. The passivation layer is disposed on sidewalls of the protrusions, the insulating layer, and the capping layer. The passivation layer comprises at least one first film and at least one second film arranged in a staggered configuration.

One aspect of the present disclosure provides a method of processing a semiconductor substrate. The method includes steps of providing a supporting substrate; depositing an insulating layer on the supporting substrate; depositing a capping layer on the insulating layer; patterning the capping layer and the insulating layer to form a plurality of trenches penetrating through the capping layer and the insulating layer, and extending into the supporting substrate, wherein the remaining supporting substrate comprises a base and a plurality of protrusions connected to the base; depositing a passivation layer on the sidewalls of the capping layer, the insulating layer and the protrusions; and etching the base through the trenches to form a plurality of mesas underlying the protrusions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor substrate, comprising:
   a base;
   a plurality of mesas extending from an upper surface of the base;
   a plurality of protrusions connected to the mesas;
   an insulating layer disposed on the protrusions;
   a capping layer disposed on the insulating layer; and
   a passivation layer disposed on sidewalls of the protrusions, the insulating layer, and the capping layer, wherein the passivation layer comprises at least one first film and at least one second film arranged in a staggered configuration;
   wherein each of the plurality of mesas includes a top surface, and the plurality of protrusions and the passivation layer are directly deposited on and extend from the top surface of each of the plurality of mesas.

2. The semiconductor substrate of claim 1, wherein outer peripheries of the passivation layer are continuous with sidewalls of the mesas.

3. The semiconductor substrate of claim 1, wherein the protrusions have a critical dimension and a height being greater than twice the critical dimension.

4. The semiconductor substrate of claim 1, wherein a width of the mesas gradually decreases at positions of increasing distance from the base.

5. The semiconductor substrate of claim 4, wherein included angles between the base and the mesas are in a range between 90 and 105 degrees.

6. The semiconductor substrate of claim 1, further comprising an isolation layer encircling the mesas and the passivation layer.

7. The semiconductor substrate of claim 6, wherein an upper surface of the isolation layer is coplanar with the top surface of the capping layer.

8. The semiconductor substrate of claim 1, wherein the base, the mesas and the protrusions are integrally formed.

9. The semiconductor substrate of claim 1, wherein the first film and the second film are atomic layer deposition layers.

* * * * *